(12) United States Patent
Chang et al.

(10) Patent No.: US 10,366,989 B2
(45) Date of Patent: Jul. 30, 2019

(54) SEMICONDUCTOR DEVICE HAVING A CONTACT BAR OVER AN S/D STRUCTURE

(71) Applicant: TAIWAN SEMICONDUCTOR MANUFACTURING CO., LTD., Hsinchu (TW)

(72) Inventors: Chih-Hao Chang, Chu-Bei (TW); Wen-Huei Guo, Chu-bei (TW); Yi-Shien Mor, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/299,641

(22) Filed: Oct. 21, 2016

(65) Prior Publication Data

US 2017/0229454 A1    Aug. 10, 2017

Related U.S. Application Data

(60) Provisional application No. 62/293,625, filed on Feb. 10, 2016.

(51) Int. Cl.
*H01L 27/088* (2006.01)
*H01L 29/78* (2006.01)
(Continued)

(52) U.S. Cl.
CPC .. *H01L 27/0886* (2013.01); *H01L 21/823431* (2013.01); *H01L 21/823475* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

| 2005/0094434 A1* | 5/2005 | Watanabe | G11C 11/412 365/156 |
| 2009/0174000 A1* | 7/2009 | Ohguro | H01L 24/05 257/368 |

(Continued)

OTHER PUBLICATIONS

Non-final Office Action issued in related U.S. Appl. No. 15/299,641, dated Feb. 4, 2019.

*Primary Examiner* — Tucker J Wright
(74) *Attorney, Agent, or Firm* — McDermott Will & Emery LLP (57) ABSTRACT

A semiconductor device includes a first fin field effect transistor (FinFET) and a contact bar (source/drain (S/D) contact layer). The first FinFET includes a first fin structure extending in a first direction, a first gate structure extending in a second direction crossing the first direction, and a first S/D structure. The contact bar is disposed over the first S/D structure and extends in the second direction crossing the first S/D structure in plan view. The contact bar includes a first portion disposed over the first S/D structure and a second portion. The second portion overlaps no fin structure and no S/D structure. A width of the second portion in the first direction is smaller than a width of the first portion in the first direction in plan view.

20 Claims, 10 Drawing Sheets (51) Int. Cl.
  *H01L 29/08* (2006.01)
  *H01L 21/8234* (2006.01)
  *H01L 23/485* (2006.01)
  *H01L 27/02* (2006.01)

(52) U.S. Cl.
  CPC ........ *H01L 23/485* (2013.01); *H01L 27/0207* (2013.01); *H01L 29/0847* (2013.01); *H01L 29/785* (2013.01)

(58) Field of Classification Search
  CPC ......... H01L 27/10826; H01L 27/10879; H01L 27/1211; H01L 29/41791; H01L 29/66795–66818; H01L 29/785–7856; H01L 2924/13067; H01L 29/04–04
  See application file for complete search history.

(56) References Cited

U.S. PATENT DOCUMENTS

| | | | |
|---|---|---|---|
| 2014/0117453 A1* | 5/2014 | Lu | H01L 29/41791 257/365 |
| 2016/0372476 A1* | 12/2016 | Hung | H01L 29/7851 |

* cited by examiner

| | |
|---|---|
| ▨ | 2: Fin structure |
| ▦ | 4: Gate structure |
| ▓ | 7: Contact bar |

SEMICONDUCTOR DEVICE HAVING A CONTACT BAR OVER AN S/D STRUCTURE

CROSS-REFERENCE TO RELATED APPLICATIONS

This application claims priority to U.S. Provisional Patent Application No. 62/293,625 filed Feb. 10, 2016, the entire disclosure of which is incorporated herein by reference.

TECHNICAL FIELD

The disclosure relates to a method for manufacturing a semiconductor device, and more particularly to a structure and a manufacturing method for a contact structure over source/drain regions.

BACKGROUND

With a decrease of dimensions of semiconductor devices, an epitaxial source/drain structure has been widely utilized for fabricating a fin field effect transistor (FinFET). Further, a contact bar (source/drain (S/D) contact layer) is formed over the epitaxial S/D structure to electrically connect the source/drain of the FinFET to an upper layer metal wiring. As the device density increases (i.e., the dimensions of semiconductor device decreases), an electrical separation between the fin structure of one FinFET and the neighboring STI (shallow trench isolation) contact becomes tighter, which may cause a short circuit between the neighboring STI contact and the fin structure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
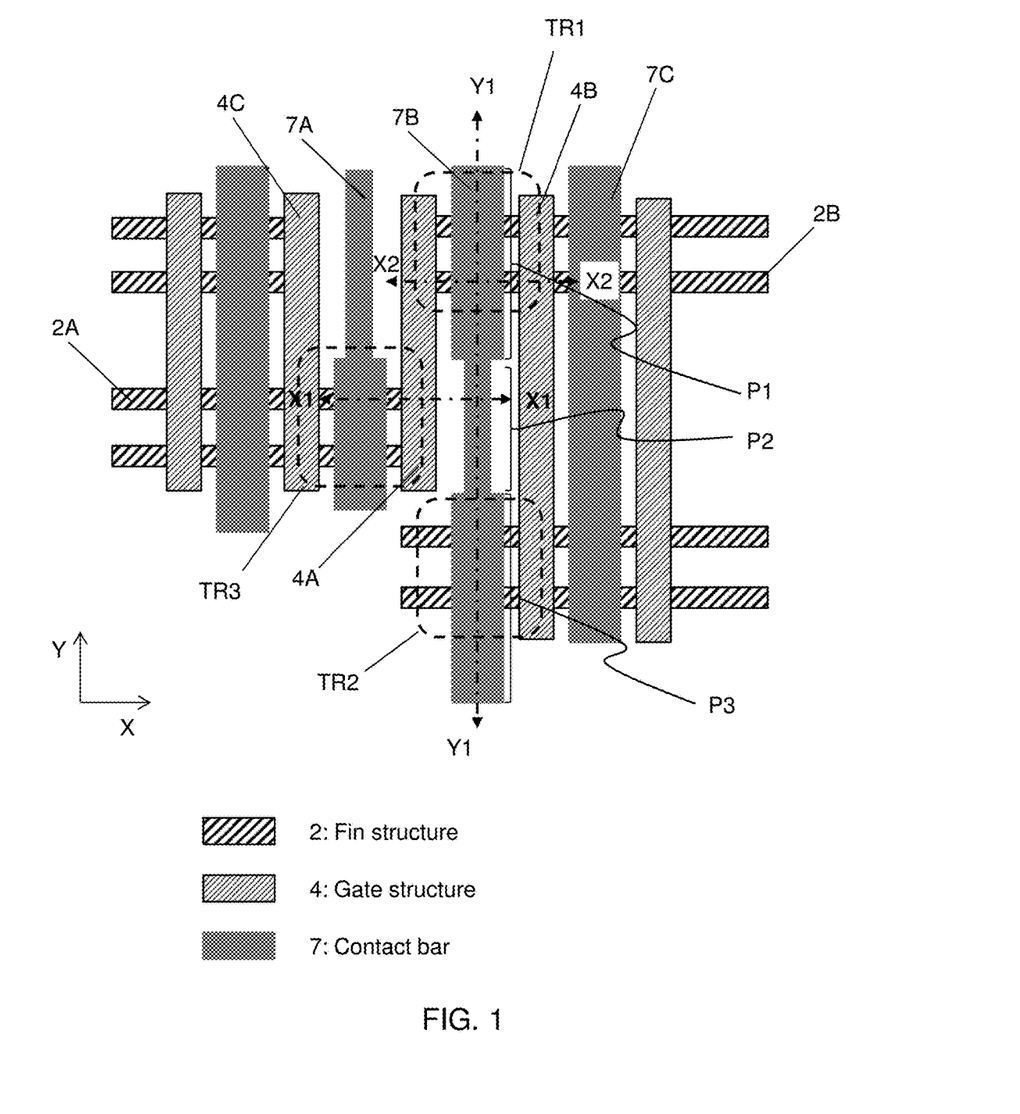
FIG. 1 shows an exemplary layout structure of a FinFET device according to one embodiment of the present disclosure.

FIG. 1 shows an exemplary layout structure of a FinFET device according to one embodiment of the present disclosure. FIG. 1 is a simplified layout structure and only relevant layers are illustrated.

As shown in FIG. 1, fin structures 2 extending in the X direction are arranged in the Y direction, gate structures 4 extending in the Y direction are arranged in the X direction and contact bars (source/drain (S/D) contact layers) 7 extending in the Y direction are arranged in the X direction. The fin structures 2 constitute a channel, a source and a drain of a FinFET. In this disclosure, a source and a drain are interchangeably used and the term source/drain (S/D) means one of a source and a drain.

The gate structure 4 is disposed over the channel of the fin structure 2, and includes a gate dielectric layer and a gate electrode layer. In some embodiments, sidewall spacers are formed on both major sides of the gate structure 4. As shown in FIG. 1, plural gate structures are arranged in the X direction with a constant pitch. Some of the gate structures are dummy gate structures which do not constitute a transistor. In FIG. 1, the gate structure 4A may be a dummy gate structure.

In FIG. 1, three FinFETs TR1, TR2 and TR3 are illustrated. Each of the three FinFETs TR1, TR2 and TR3 includes two fin structures. In such a case, an epitaxially formed semiconductor layer formed on one fin structure is merged with an epitaxially formed semiconductor layer formed on the other fin structure. The number of the fin structures included in one FinFET may be one or three or more. Although two fins are electrically connected by STI contact 7 in FIG. 7, the present embodiments are not limited to the structure of FIG. 1. In some embodiments, single fin constitute one FinFET.

The source and drain include an S/D structure including an epitaxially formed semiconductor layer. The S/D structure further includes a silicide layer formed on the epitaxially formed semiconductor layer. A contact bar 7 is disposed on the S/D structure and electrically connects the S/D structure to an upper conductive layer (vertical connection) and/or another S/D structure (horizontal connection). The contact bars 7 are disposed between the gate structures 4 and over an isolation insulating layer (STI)

Still referring to FIG. 1, at least one of the contact bars, for example, contact bar 7A or 7B includes at least two portions having different widths. The contact bar 7B includes a first portion P1 disposed over the S/D structure of FinFET TR1 (S/D contact portion) and a second portion P2, which overlaps no fin structure and no S/D structure and is disposed over an isolation insulating layer (STI contact portion). A width of the second portion P2 in the X direction is smaller than a width of the first portion P1 in the X direction in plan view. In the present disclosure, the first portion includes adjacent areas adjacent to the S/D structure in the Y direction, where each of the adjacent areas having a length in the Y direction which is the same as the width of the fin structure.

The contact bar 7B further includes a third portion P3 disposed over the S/D structure of the FinFET TR2. A width of the third portion in the X direction is substantially equal to the width of the first portion P2 in the X direction in plan view. Here, the substantially equal width means that two portions are designed to have the same width and the difference of the widths of two portions is within a process variation or a measurement variation known in the art (e.g., a few nm). Further, the width is measured at the middle of each portion.

As shown in FIG. 1, the second portion P2 is located at a region which faces an end of the fin structures (e.g., 2A) of the FinFET TR3.

Figures 2A, 2C:
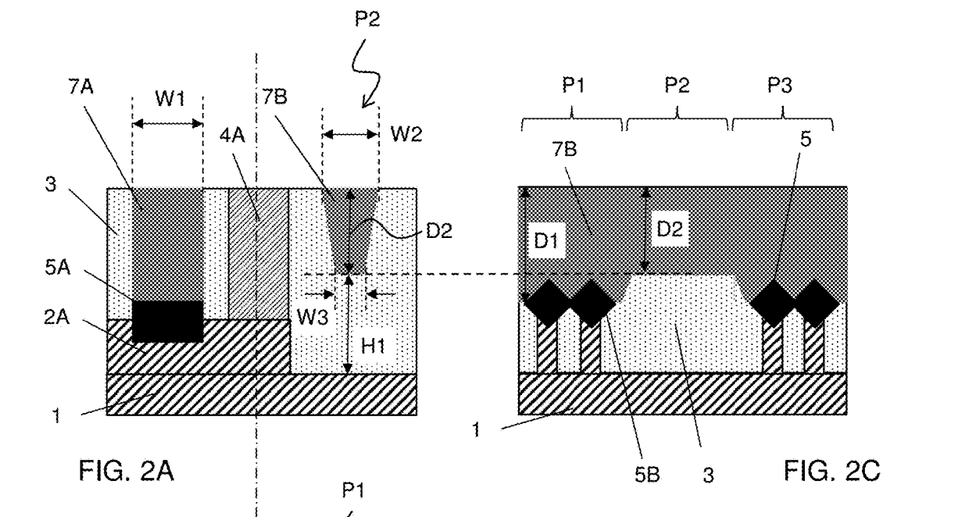
FIG. 2A shows an exemplary cross sectional view along line X1-X1 of FIG. 1.
FIG. 2C shows an exemplary cross sectional view along line Y1-Y1 of FIG. 1.
Figure 2B:
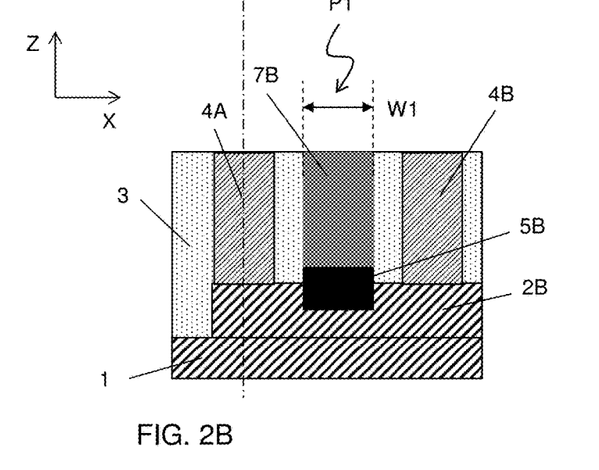
FIG. 2B shows an exemplary cross sectional view along line X2-X2 of FIG. 1.

FIG. 2A shows an exemplary cross sectional view along line X1-X1 of FIG. 1, FIG. 2B shows an exemplary cross sectional view along line X2-X2 of FIG. 1, and FIG. 2C shows an exemplary cross sectional view along line Y1-Y1 of FIG. 1. In FIGS. 2A-2C, fin structures 2A and 2B, gate structures 4A and 4B, S/D structures 5 (5A and 5B) and contact bars 7A, 7B are formed over the substrate 1.

As shown in FIGS. 2A and 2B, the width W2 of the second portion P2 of the contact bar 7B in the X direction measured at the upper face of the second portion P2 is smaller than the width W1 of the first portion P1 in the X direction. Further, as shown in FIG. 2C, the thickness (or depth) D2 of the second portion P2 in the Z direction is smaller than the thickness D1 of the first portion P1 in the Z direction. The thickness D1 of the first portion P1 is defined as the average thickness in the first portion, and is the vertical distance between the upper surface of the contact bar 7B in the first portion and the upper surface of the underlying insulating layer 3 in the first portion. The thickness D2 of the second portion P2 is defined as the average thickness in the second portion, and is the vertical distance between the upper surface of the contact bar 7B in the second portion and the upper surface of the underlying insulating layer 3 in the second portion. In certain embodiments, as shown in FIG. 2A, the second portion P2 of the contact bar 7B has a tapered shape with a bottom width W3 being smaller than the top width W2. In other embodiments, however, no tapered shape is formed.

If the thickness (depth) D2 in the second portion P2 is equal to or greater than the thickness (depth) D1, the distance between the contact bar 7B and the edge of the fin structure 2A decreases, and an electrical separation may become insufficient. Further, if the thickness (depth) D2 in the second portion P2 becomes much greater than the thickness (depth) D1, the distance (H1) between the contact bar 7B and the substrate 1 (and the fin structure 2A) decreases, and an electrical separation may become insufficient. However, as shown in FIGS. 2A and 2C, since the thickness (depth) D2 in the second portion P2 is smaller than the thickness (depth) D1 and the bottom of the contact bar 7B is located above the fin structure 2A, it is possible to sufficiently secure the electrical separation between the contact bar 7B and the fin structure 2A and/or the substrate 1. In particular, with the foregoing structure can prevent the contact bar 7B and the fin structure from contacting to each other due to process variations. Accordingly, it is possible to prevent a short-circuit between the contact bar 7B and the fin structure 2A and/or the substrate 1, and/or to suppress a leakage current between the contact bar 7B and the fin structure 2A and/or the substrate 1.

In some embodiments, the difference between the width W1 and width W2 is in a range from about 1 nm to about 10 nm, and is in a range from about 2 nm to about 4 nm in other embodiments. The difference between the thickness (depth) D1 and thickness (depth) D2 is in a range from about 3 nm to about 30 nm in some embodiments, and is in a range from about 8 nm to about 12 nm in other embodiments.

Figure 3:
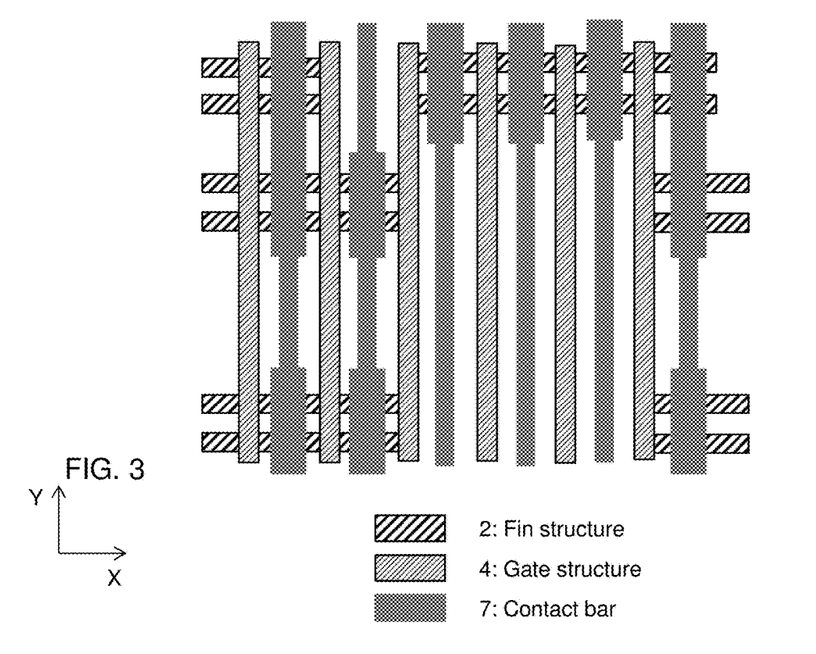
FIGS. 3 and 4 show exemplary layout structures of a FinFET device according to other embodiments of the present disclosure.
Figure 4:
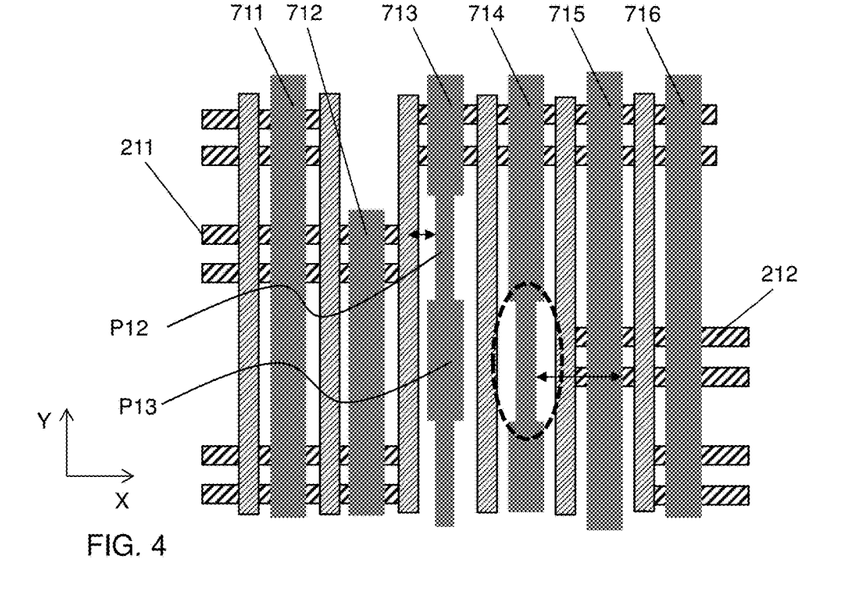

FIGS. 3 and 4 show exemplary layout structures of a FinFET device according to other embodiments of the present disclosure.

In FIG. 3, each of the contact bars 7 includes a first portion disposed over an S/D structures and a second portion which overlaps no fin structure and no S/D structure. In other words, in FIG. 3, the width of the contact bars 7 is larger (i.e., first portions) only in the regions over the S/D structures.

In FIG. 4, the width of the contact bars 7 is narrower (i.e., second portions) only in the regions where adjacent fin structures are located closer to the S/D structures. For example, contact bars 713 or 714 include second portions in regions where adjacent fin structures 2 are located closer to the S/D structures. A distance in the X direction between the second portion P12 of the contact bar 713 and an end of a fin structure 211 closer to the contact bar 713 in the X direction is equal to or smaller than a first threshold distance S1. The widths of the contact bars 7 disposed over the S/D structures (i.e., the width of the first portion W1) are larger than that of the second portion P12 (i.e., the width of the first portion W1). Similarly, the contact bar 714 has a second portion having a narrower width where the fin structure 212 is closer to the contact bar 714, as shown in FIG. 4. Further, even if the contact bars 7 include portions which overlap no fin structure and no S/D structure, as long as the distance between the contact bar and the closest fin structure is more than the first threshold distance S1, the widths of such portions is set to W1. Accordingly, the contact bars 711, 712, 715 and 716 include no second portion (with a narrow width W2) and have a constant width.

In some embodiments, the contact bar includes a second portion if the contact bar includes a region where adjacent fin structures 2 are located closer to the S/D structures than the first threshold distance S1, and if the contact bar includes such a portion, the contact bar has the width W1 (as the width of the first portion) only over the S/D structure and has the width W2 (as the width of the second portion) in other portions. If the contact bar does not include such a portion, the contact bar has a constant width W1.

The layout structure of FIG. 3 and FIG. 4 may be used in a mixed manner. Further, it is noted that the thickness of the contact bars at the second portions (narrow portions) is smaller than the thickness of the contact bars at the first and third portions (broader portions).

The sequential fabrication operations for manufacturing a semiconductor FinFET device according to one embodiment of the present disclosure will be explained using FIGS. 5A-11.

Figure 5A:
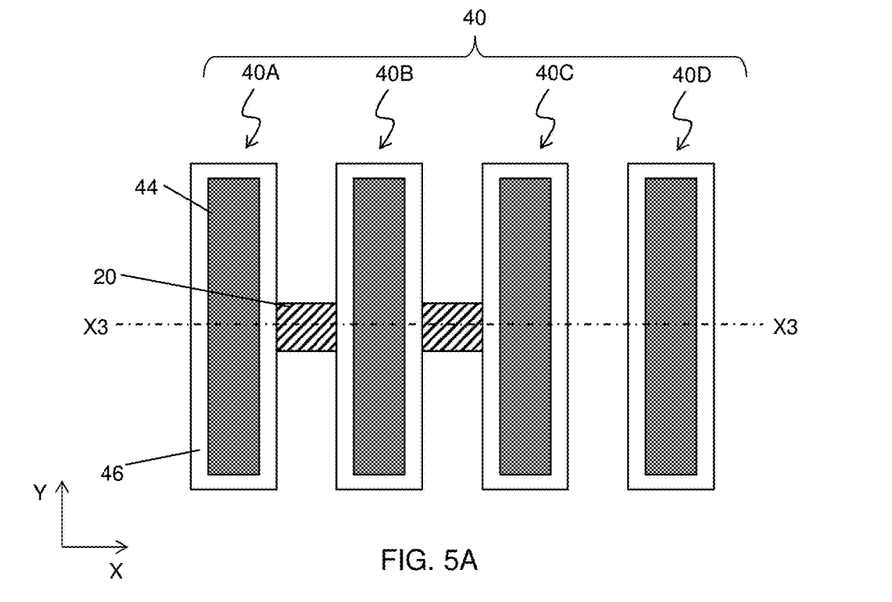
FIG. 5A shows an exemplary plan view (viewed from the above) illustrating one stage of a sequential fabrication process of a semiconductor device according to one embodiment of the present disclosure.
Figure 5B:
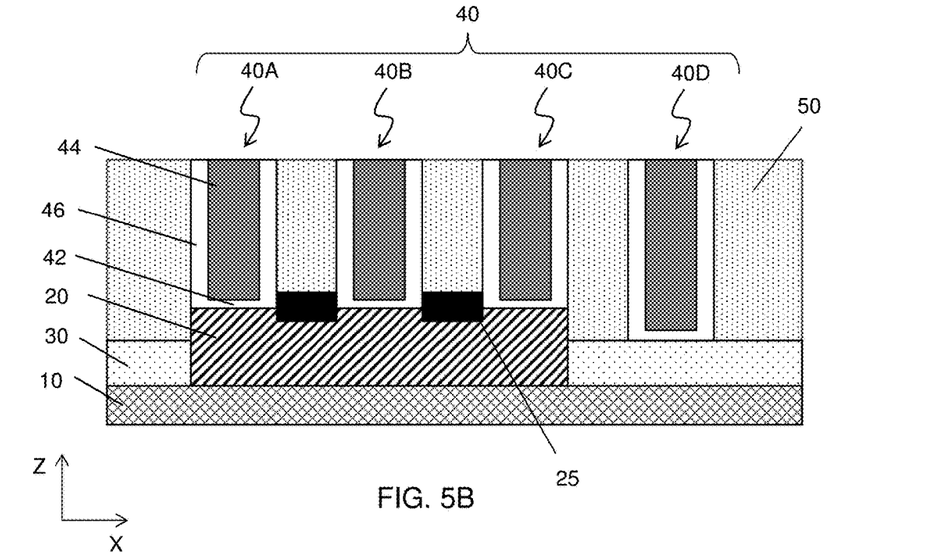
FIG. 5B shows an exemplary cross sectional view along line X3-X3 of FIG. 5A.

FIGS. 5A and 5B show one stage of the sequential fabrication operations according to one embodiment of the present disclosure. FIG. 5A shows a plan (top) view and FIG. 5B shows a cross sectional view along line X3-X3 of FIG. 5A.

FIGS. 5A and 5B show a structure of a semiconductor device after metal gate structures are formed. In FIGS. 5A and 5B, metal gate structures 40 are formed over a channel layer, for example, a part of a fin structure 20 formed over a substrate 10. The metal gate structures 40 include first to fourth metal gate structures 40A, 40B, 40C and 40D, and extend in the Y direction and are arranged in the X direction. The thickness of the metal gate structures 40 is in a range from about 5 nm to about 200 nm in some embodiments. Each of the gate structures 40 includes a gate dielectric layer 42, a metal gate electrode 44 and sidewall spacers 46 provided on major sidewalls of metal gate electrode 44. The sidewall spacers 46 are made of at least one of SiN, SiON, AlO and AlON. The film thickness of the sidewall spacers 46 at the bottom of the sidewall spacers is in a range from about 2 nm to about 20 nm in some embodiments, and is in a range from about 4 nm to about 8 nm in other embodiments. Further, source/drain (S/D) regions 25 are formed adjacent to the gate structures, and spaces between the gate structures are filled with a first interlayer dielectric (ILD) layer 50. The first ILD layer 50 includes one or more layers of insulating material, such as $SiO_2$, SiN, SiON, SiOCN, SiCN or SiCO. In one embodiment, $SiO_2$ is used. In some embodiments, a silicide layer (not shown) is formed over the S/D regions 25.

Figure 5C:
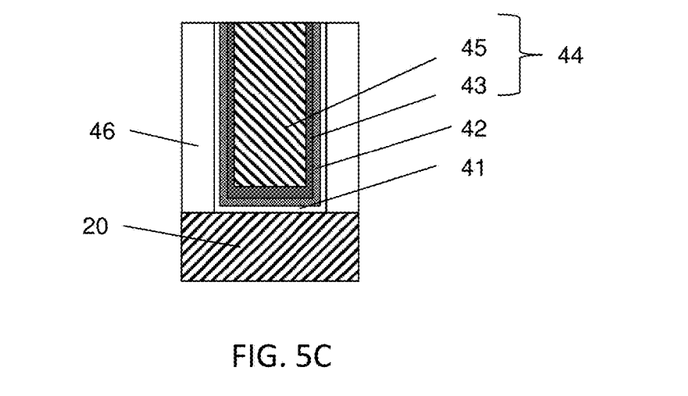
FIG. 5C is an enlarged view of the gate structure shown in FIG. 5B.

FIG. 5C is an enlarged view of the gate structure. The metal gate structure 40 includes one or more layers 45 of metal material, such as Al, Cu, W, Ti, Ta, TiN, TiAl, TiAlC, TiAlN, TaN, NiSi, CoSi, and other conductive materials. A gate dielectric layer 42 disposed between the channel layer and the metal gate electrode 44 includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interface dielectric layer 41 made of, for example silicon dioxide, is formed between the channel layer and the gate dielectric layer 42.

In some embodiments, one or more work function adjustment layers 43 are interposed between the gate dielectric layer 42 and the metal material 45. The work function adjustment layers 43 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

In this embodiment, fin field effect transistors (FinFETs) fabricated by a gate-replacement process are employed.

Figure 5D:
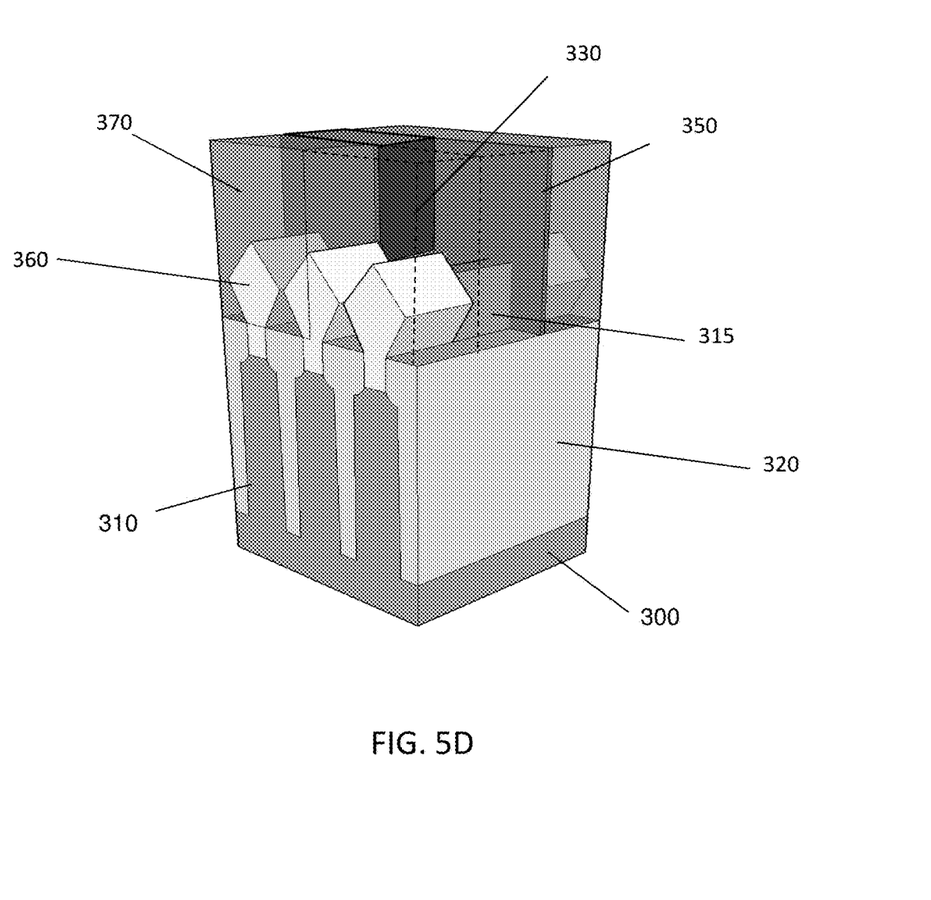
FIG. 5D shows an exemplary perspective view illustrating one stage of a sequential fabrication process of a semiconductor device according to one embodiment of the present disclosure.

FIG. 5D shows an exemplary perspective view of a FinFET structure.

First, a fin structure 310 is fabricated over a substrate 300. The fin structure includes a bottom region and an upper region as a channel region 315. The substrate is, for example, a p-type silicon substrate with an impurity concentration in a range from about $1 \times 10^{15}$ $cm^{-3}$ to about $1 \times 10^{18}$ $cm^{-3}$. In other embodiments, the substrate is an n-type silicon substrate with an impurity concentration in a range from about $1 \times 10^{15}$ $cm^{-3}$ to about $1 \times 10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region 360. After a planarization operation, the dummy gate structure is removed so as to make a gate space. Then, in the gate space, a metal gate structure 330 including a metal gate electrode and a gate dielectric layer, such as a high-k dielectric layer, is formed. In FIG. 5D, the view of parts of the metal gate structure 330, sidewalls 330 and the ILD 370 are cut to show the underlying structure.

The metal gate structure 330 and the sidewalls 330, source/drain 360 and the ILD 370 of FIG. 5D substantially correspond to the metal gate structure 40, source/drain regions 25 and first interlayer dielectric layer (ILD) 50, of FIGS. 5A and 5B, respectively.

Figure 6:
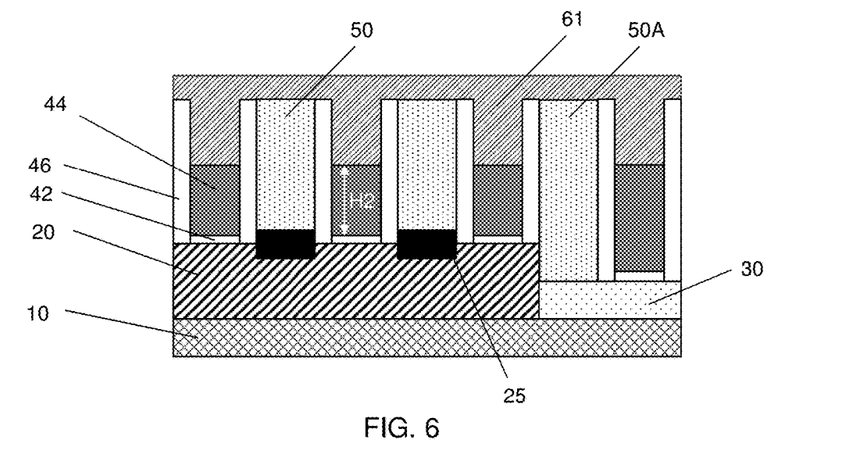
FIGS. 6-11 show exemplary cross sectional views illustrating various stages of the sequential fabrication process of a semiconductor device according to one embodiment of the present disclosure.
Figure 7:
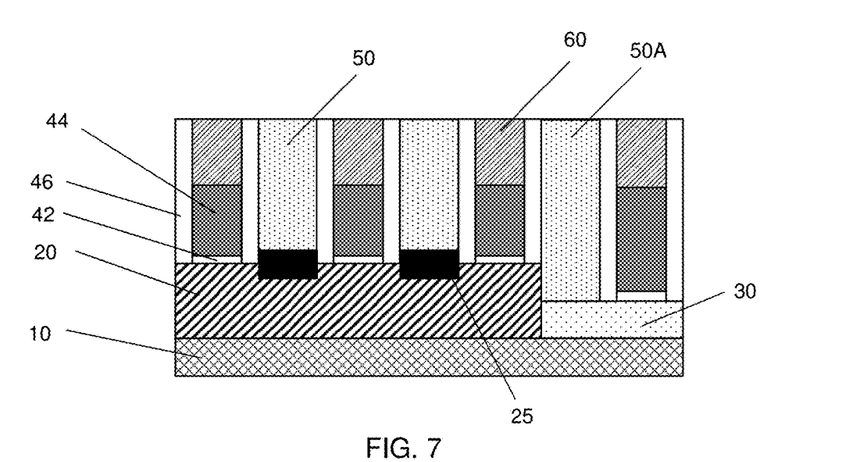
Figure 8:
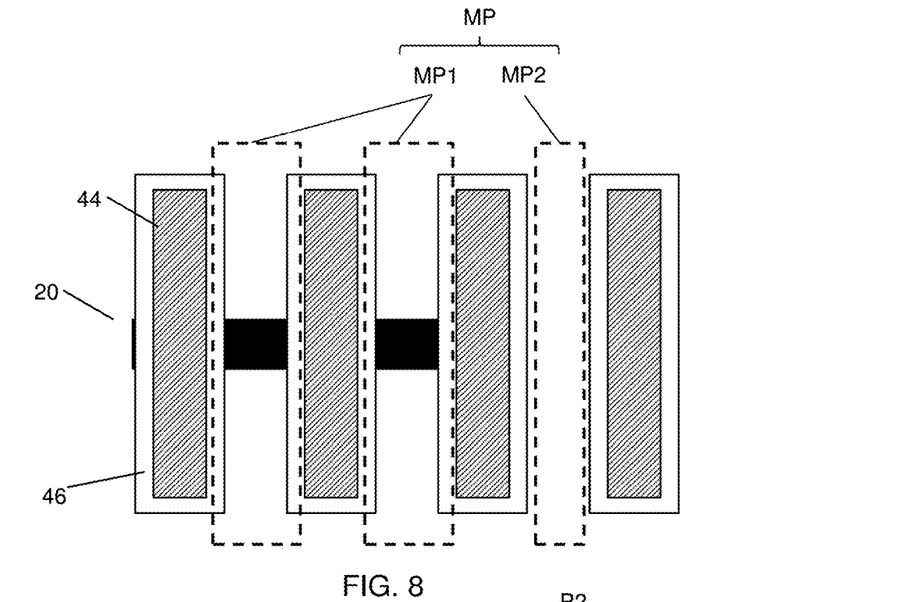

FIGS. 6-11 show various stages of the sequential fabrication operation of a semiconductor FinFET device according to one embodiment of the present disclosure. FIGS. 6, 7 and 9-11 show exemplary cross sectional views corresponding to line X3-X3 of FIG. 5A and FIG. 8 shows a plan view. It is understood that additional operations can be provided before, during, and after processes shown by FIGS. 6-11, and some of the operations described below can be replaced or eliminated, for additional embodiments of the method. Not all layers or features are illustrated in the figures. The order of the operations/processes may be interchangeable.

As shown in FIG. 6, the metal gate electrodes 44 are recessed below the upper surface of the sidewall spacers 46 by a dry and/or a wet etching operation. The remaining height H2 of the recessed gate electrode 44 is in a range from about 25 nm to about 50 nm in some embodiments.

After the gate electrodes 44 are recessed, a blanket layer 61 of a first insulating material is formed, as shown in FIG. 6. The first insulating material includes one or more of SiC, SiON and SiOCN.

A planarization operation, such as an etch-back process or a chemical mechanical polishing (CMP) process, is performed on the blanket layer 61, so that the gate cap insulating layers 60 are formed over the gate electrode 44, as shown in FIG. 7. In certain embodiments, the forming the cap insulating layer 60 is not necessary.

As shown in FIG. 8, a mask pattern MP including openings MP1 and MP2 are formed over the structure of FIG. 7. The width of the opening MP2 is smaller than the width of the opening MP1. In some embodiments, the width of the opening MP2 is about 50-90% of the width of the mask pattern MP1. The mask opening MP2 corresponds to the second portions of FIGS. 1-4. The width of the mask pattern MP1 is equal to or larger than the space between the gate structures. In certain embodiment, width of the mask pattern MP1 can be smaller than the space between the gate structures.

Figure 9:
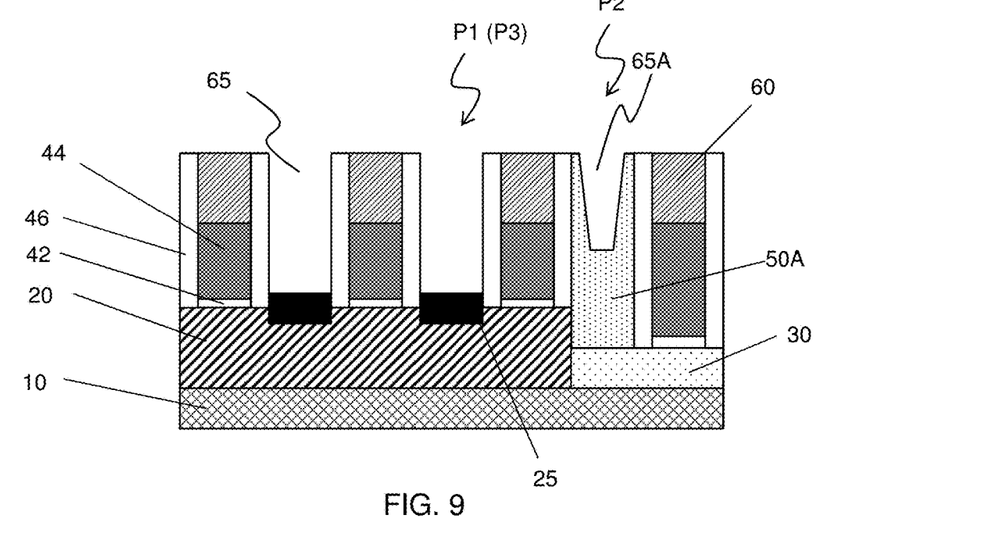

Then, as shown in FIG. 9, the first ILD layer 50 is etched by a dry and/or a wet etching by using the mask pattern MP as an etching mask, thereby forming openings 65 and 65A. In the openings 65, the source/drain structures 25 are exposed at the bottoms of the openings 65. However, in the opening 65A, since the width of the opening 65A is smaller, the etching of the first ILD layer 50A stops at the middle of the first ILD layer 50A. As shown in FIG. 9, the bottom of the opening 65A is located above the edge of the fin structure 20.

Figure 12:
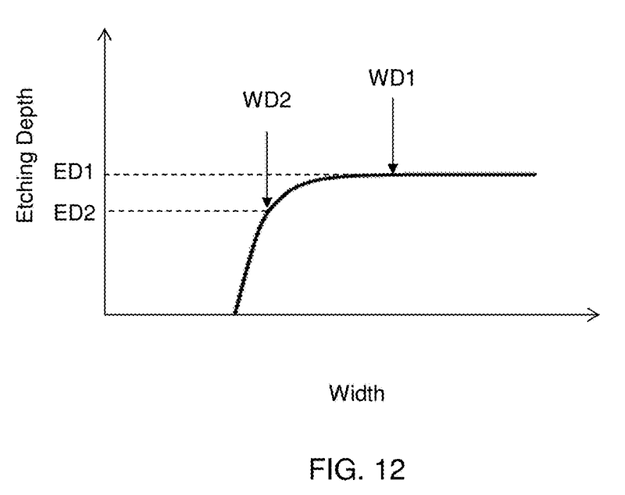
FIG. 12 illustrates an opening width dependency on an etching depth.

In the etching, in particular, dry etching, of ten-nanometer order scale openings, the etching depth is sensitive to the opening width. As shown in FIG. 12, when the width of the opening is relatively large (e.g., WD1), the etching depth does not depend on the width and a substantially constant depth ED1 can be obtained. However, when the width becomes smaller (e.g., WD2), the etching depth becomes smaller, e.g., ED2.

In the present embodiment, by making the width of the opening MP2 for the second portion smaller than the width of the opening MP1, a shallower opening 65A can be fabricated in the first ILD layer 50A.

Figure 10:
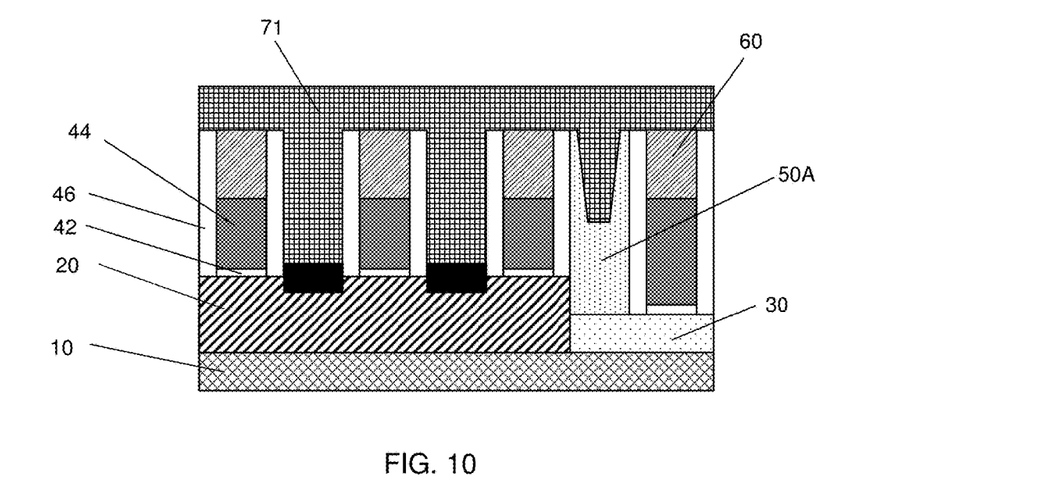

Subsequently, a blanket layer of a first conductive material 71 is formed, as shown in FIG. 10. The first conductive material 71 includes one or more of W, Co, Ni, or Ti. In one embodiment, W is used.

Figure 11:
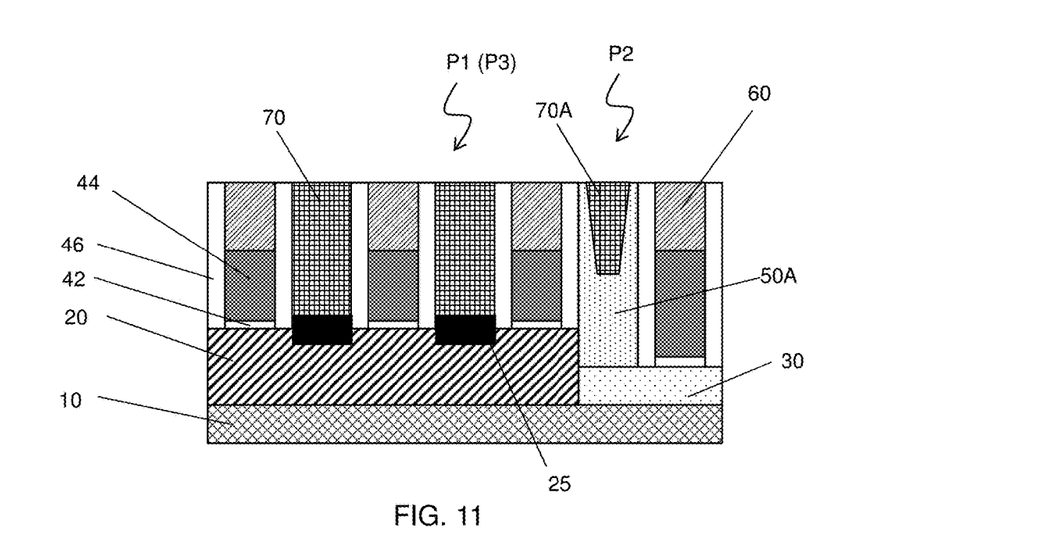

A planarization operation, such as an etch-back process or a CMP process, is performed on the blanket layer 71, so that the contact bars 70 and 70A are formed over the source/drain regions 25, as shown in FIG. 11. As shown in FIG. 11, the thickness and width of the contact bar 70A in the second portion P2 are smaller than those of the contact bar 70 in the first or third portion P1, P3.

In the foregoing embodiments, by making the width of the second portion smaller, the depth of the opening 65A (and the thickness of the contact bar 70A) is adjusted. In other embodiment, by using two or more patterning operations (lithography and etching), the depth of the second portion can be adjusted. In such a case, the width of the second portion can be the same as that of the first portion. In other words, only the thickness (depth) of the second portion of the contact bar is smaller than that of the first and/or third portion.

It is understood that the device shown in FIG. 11 undergoes further CMOS processes to form various features such as interconnect metal layers, dielectric layers, passivation layers, etc.

Figure 13:
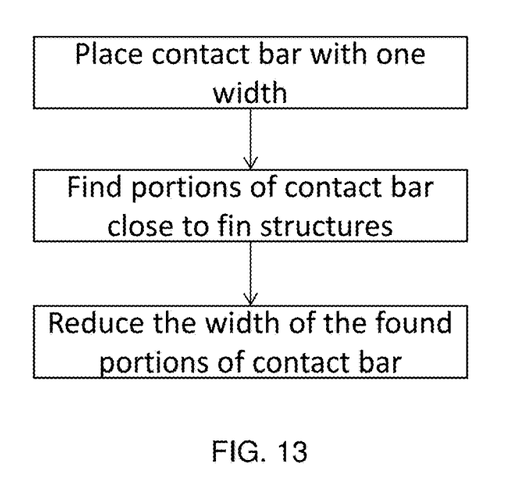
FIGS. 13-15 illustrate a flow of designing the contact bars according to one embodiment of the present disclosure.
Figure 14:
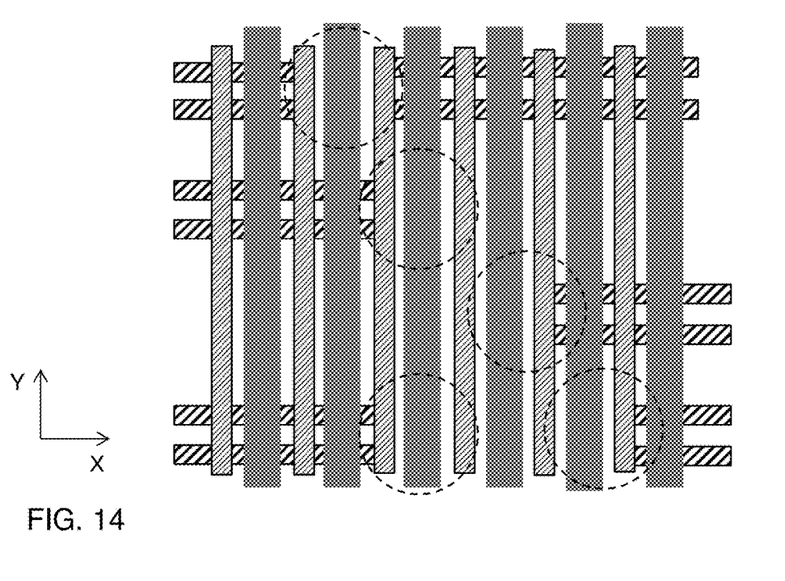
Figure 15:
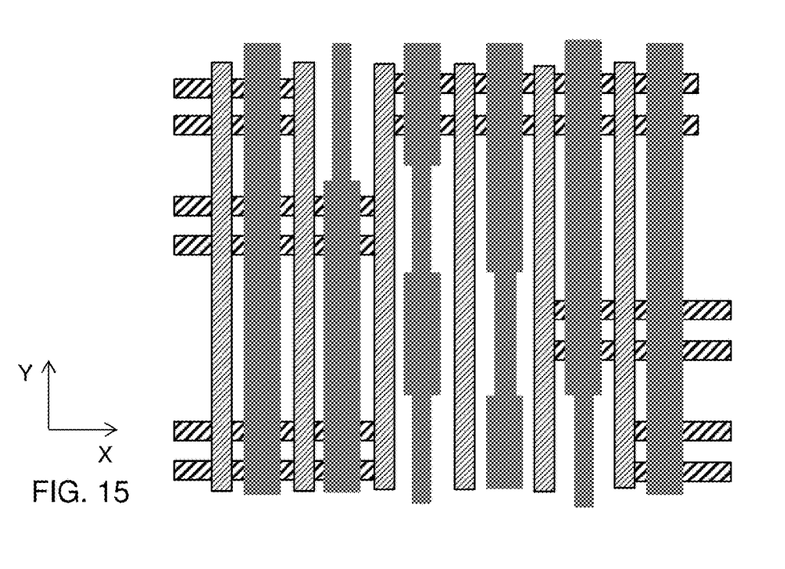

FIGS. 13-15 illustrate a flow of designing the contact bars according to one embodiment of the present disclosure.

In the flow chart of FIG. 13, the initial contact bar patterns are placed between gate patterns. Then, as shown in FIG. 14. Portions of the initial contact bar pattern which are closer to any of fin structures in the X direction than the predetermined distance (e.g., the first threshold distance (S1)) are found. In FIG. 14, the circled portions are found. Then, the width of such portions in the X direction is reduced as shown in FIG. 15.

The portions of which widths are not reduced become first or third portions depending on the underlying structures. If the length of the third portion along the Y direction is smaller than a threshold value, the third portion may be replaced with a second portion.

In the present embodiments, by making a thickness of the second portion of the contact bar smaller, it is possible to sufficiently secure the electrical separation between the contact bar and the fin structure and/or the substrate. Accordingly, it is possible to prevent a short-circuit between the contact bar and the fin structure and/or the substrate, and/or to suppress a leakage current between the contact bar and the fin structure and/or the substrate. Further, by simply making the width of the second portion smaller, it is possible to control the depth of the opening in which the contact bar is formed.

It will be understood that not all advantages have been necessarily discussed herein, no particular advantage is required for all embodiments or examples, and other embodiments or examples may offer different advantages.

According to one aspect of the present disclosure, a semiconductor device includes a first fin field effect transistor (FinFET) and a contact bar. The first FinFET includes a first fin structure extending in a first direction, a first gate structure extending in a second direction crossing the first direction, and a first S/D structure. The contact bar is disposed over the first S/D structure and extends in the second direction crossing the first S/D structure in plan view. The contact bar includes a first portion disposed over the first S/D structure and a second portion. The second portion overlaps no fin structure and no S/D structure. A width of the second portion in the first direction is smaller than a width of the first portion in the first direction in plan view.

According to another aspect of the present disclosure, a semiconductor device includes plural fin field effect transistors (FinFETs) and plural contact bars. Each of the plural FinFETs includes a fin structure extending in a first direction, a gate structure extends in a second direction crossing the first direction, and an S/D structure. The plural contact bars are disposed over a first S/D structure among the plural S/D structure and extending in the second direction. The plural contact bars include a first contact bar. The first contact bar includes a first portion disposed over the first S/D structure and a second portion. The second portion overlaps no fin structure and no S/D structure. A width of the second portion in the first direction is smaller than a width of the first portion in the first direction in plan view.

In accordance with yet another aspect of the present disclosure, in a method of manufacturing a semiconductor device including fin field effect transistors (FinFETs), gate structures are formed. The gate structures extend in a first direction and are arranged in a second direction crossing the first direction. Source/drain (S/D) structures are formed between adjacent two gate structures. An insulating layer is formed over the source/drain structures. A mask layer is formed over the insulating layer, the mask layer having a mask opening. A part of the insulating layer is removed through the mask opening to form an opening. The opening is filled with a conductive material, thereby forming a contact bar. The mask opening extends in the first direction and includes a first portion disposed over one of the S/D structures and a second portion. The second portion overlaps no fin structure and no S/D structure. A thickness of the second portion is smaller than a thickness of the first portion in a cross sectional view.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first fin field effect transistor (FinFET) including a first fin structure extending in a first direction, a first gate structure extending in a second direction crossing the first direction, and a first source/drain (S/D) structure;
    an interlayer dielectric layer; and
    a contact bar embedded in the interlayer dielectric layer and disposed over the first S/D structure and extending in the second direction in plan view, wherein:
    the contact bar includes a first portion disposed over the first S/D structure and a second portion, which are disposed between the first gate structure and another gate structure that is a dummy gate structure, under which another fin structure is disposed,
    the dummy gate structure is a closest gate structure to the second portion,
    the second portion overlaps no fin structure and no S/D structure,
    the second portion is located on a line extending from the another fin structure in the first direction, and
    a width of the second portion in the first direction facing the another fin structure is smaller than a width of the first portion in the first direction in plan view.

2. The semiconductor FinFET device of claim 1, wherein a thickness of the second portion is smaller than a thickness of the first portion in a cross sectional view.

3. The semiconductor device of claim 1, further comprising:
    a second FinFET including a second fin structure extending in the first direction, a second gate structure extending in the second direction, and a second S/D structure, wherein:
    the contact bar connects the first S/D structure and the second S/D structure,
    the contact bar includes a third portion disposed over the second S/D structure, and
    the width of the second portion in the first direction is smaller than a width of the third portion in the first direction in plan view.

4. The semiconductor device of claim 3, wherein the width of the third portion is equal to the width of the first portion.

5. The semiconductor device of claim 3, wherein a thickness of the second portion is smaller than a thickness of the first portion in a cross sectional view.

6. The semiconductor device of claim 5, wherein the thickness of the second portion is smaller than a thickness of the third portion in a cross sectional view.

7. The semiconductor device of claim 3, wherein the second portion is disposed between the first portion and the third portion.

8. The semiconductor device of claim 3, further comprising:
    a third FinFET including a third fin structure extending in the first direction, a third gate structure extending in the second direction, and a third S/D structure, wherein:
    the first to third fin structures extend in the first direction and the first to third fin structures are arranged in the second direction,
    the third gate structure is different from the first gate structure, and
    an end of the third fin structure faces the second portion.

9. A semiconductor device, comprising:
    plural fin field effect transistors (FinFETs), each of which includes a fin structure extending in a first direction, a gate structure extending in a second direction crossing the first direction, and a source/drain (S/D) structure; and
    plural contact bars disposed over a first S/D structure among the plural S/D structure and extending in the second direction, wherein:
    the plural contact bars include a first contact bar,
    the first contact bar includes a first portion disposed over the first S/D structure and a second portion,
    the second portion overlaps no fin structure and no S/D structure,
    a width of the second portion in the first direction is smaller than a width of the first portion in the first direction in plan view,
    the plural contact bars further include a second contact bar arranged in parallel with the first contact bar, and
    a width of the second contact bar in the first direction is constant except for end portions.

10. The semiconductor device of claim 9, wherein a thickness of the second portion is smaller than a thickness of the first portion in a cross sectional view.

11. The semiconductor device of claim 9, wherein the width of the second contact bar is equal to the width of the first portion.

12. The semiconductor device of claim 9, wherein:
    the plural contact bars further include a third contact bar arranged in parallel with the first contact bar at a opposite side of the second contact bar,
    the third contact bar includes a third portion disposed over a second S/D structure among the plural S/D structures and a fourth portion,
    the fourth portion overlaps no fin structure and no S/D structure, and a width of the third portion in the first direction is equal to a width of the fourth portion in the first direction in plan view.

13. The semiconductor device of claim 12, wherein the width of the third portion is equal to the width of the first portion.

14. The semiconductor device of claim 12, wherein:
a distance in the first direction between the second portion and an end of a closest fin structure of one of the FinFETs is equal to or smaller than a first distance, and
a distance in the first direction between the fourth portion and an end of a closest fin structure of one of the FinFETs is more than the first distance.

15. The semiconductor device of claim 9, wherein:
the first contact bar further includes a third portion,
the second portion is disposed between the first portion and the third portion, and
a width of the third portion in the first direction is equal to the width of the first portion in the first direction.

16. The semiconductor device of claim 15, wherein the third portion is disposed over a second S/D structure among the plural S/D structures.

17. The semiconductor device of claim 15, wherein the third portion overlaps no fin structure and no S/D structure.

18. The semiconductor device of claim 17, wherein:
a distance in the first direction between the second portion and an end of a closest fin structure of one of the FinFETs is equal to or smaller than a first distance, and
a distance in the first direction between the third portion and an end of a closest fin structure of one of the FinFETs is more than the first distance.

19. A semiconductor device, comprising:
a first fin field effect transistor (FinFET) including a first fin structure extending in a first direction, a first gate structure extending in a second direction crossing the first direction, and a first source/drain (S/D) structure;
a second FinFET including a second fin structure extending in the first direction, a second gate structure extending in the second direction, and a second S/D structure; and
a contact bar disposed over the first S/D structure and the second S/D structure, and extending in the second direction in plan view, wherein:
the contact bar includes a first portion disposed over the first S/D structure, a second portion and a third portion disposed over the second S/D structure,
the second portion overlaps no fin structure and no S/D structure,
a width of the second portion in the first direction is smaller than a width of the first portion in the first direction and is smaller than a width of the third portion in the first direction, in plan view, and
a thickness of the second portion is smaller than a thickness of the first portion in a cross sectional view.

20. The semiconductor device of claim 19, wherein:
the width of the third portion is equal to the width of the first portion, and
the thickness of the second portion is smaller than a thickness of the third portion in the cross sectional view.

* * * * *